(12) United States Patent
Sarkar

(10) Patent No.: US 7,952,131 B2
(45) Date of Patent: May 31, 2011

(54) LATERAL JUNCTION VARACTOR WITH LARGE TUNING RANGE

(75) Inventor: Manju Sarkar, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 12/819,228

(22) Filed: Jun. 21, 2010

(65) Prior Publication Data

US 2010/0258910 A1     Oct. 14, 2010

Related U.S. Application Data

(62) Division of application No. 11/858,890, filed on Sep. 20, 2007, now Pat. No. 7,741,187.

(51) Int. Cl.
H01L 27/108 (2006.01)

(52) U.S. Cl. ........ 257/312; 257/197; 257/577; 257/596; 257/597; 257/E27.049; 257/E29.344; 438/328; 438/329; 438/330; 438/379

(58) Field of Classification Search .................. 257/197, 257/312, 577, 595, 596, 597, E27.049, E29.344; 438/328, 329, 330, 379
See application file for complete search history.

(56) References Cited

U.S. PATENT DOCUMENTS

| | | |
|---|---|---|
| 5,500,387 A | 3/1996 | Tung et al. |
| 5,525,533 A | 6/1996 | Woodruff et al. |
| 5,608,258 A | 3/1997 | Rajkanan et al. |
| 5,936,282 A | 8/1999 | Baba et al. |
| 5,998,255 A | 12/1999 | Kung et al. |
| 6,222,221 B1 | 4/2001 | Hou et al. |
| 6,407,412 B1 | 6/2002 | Iniewski et al. |
| 6,489,196 B1 | 12/2002 | Lin et al. |
| 6,667,506 B1 | 12/2003 | Reedy et al. |
| 6,667,539 B2 | 12/2003 | Adler |
| 6,825,089 B1 | 11/2004 | Shapira et al. |
| 6,847,095 B2 | 1/2005 | Benaissa et al. |
| 6,864,528 B2 | 3/2005 | Maget |
| 6,882,029 B1 * | 4/2005 | Gau et al. ...................... 257/595 |

(Continued)

OTHER PUBLICATIONS

H.S. Bennett et al., Device and Technology Evolution for Si-based RF integrated circuits, IEEE Transactions on Electron Devices, Jul. 2005 pp. 1235-1258, vol. 52, Issue 7.

*Primary Examiner* — Long K Tran
(74) *Attorney, Agent, or Firm* — Horizon IP Pte Ltd

(57) ABSTRACT

Large tuning range junction varactor includes first and second junction capacitors coupled in parallel between first and second varactor terminals. First and second plates of the capacitors are formed by three alternating doped regions in a substrate. The second and third doped regions are of the same type sandwiching the first doped region of the second type. A first varactor terminal is coupled to the second and third doped regions and a second varactor terminal is coupled to the first doped region. At the interfaces of the doped regions are first and second depletion regions, the widths of which can be varied by varying the voltage across the terminals from zero to full reverse bias. At zero bias condition, junction capacitance ($C_{max}$) is enhanced due to summation of two junction capacitances in parallel. At reverse bias condition, with the merging of the two junction depletion widths, the capacitor areas are drastically reduced, thereby reducing $C_{min}$ significantly. Thus, tuning range $C_{max}/C_{min}$ is significantly increased. Tuning range with this configuration can be increased infinitely by increasing the horizontal lengths of the second and third diffusion regions.

21 Claims, 13 Drawing Sheets

400

U.S. PATENT DOCUMENTS

| | | |
|---|---|---|
| 6,891,207 B2 | 5/2005 | Pequignot et al. |
| 6,943,399 B1 | 9/2005 | Gau |
| 7,019,384 B2 | 3/2006 | Maget et al. |
| 7,023,676 B2 | 4/2006 | Ker et al. |
| 7,067,384 B1 | 6/2006 | Vashchenko et al. |
| 7,378,327 B2 * | 5/2008 | Kao .............................. 438/379 |
| 2004/0207003 A1 | 10/2004 | Kim |
| 2005/0133869 A1 | 6/2005 | Ker et al. |
| 2005/0179113 A1 | 8/2005 | Kim et al. |
| 2006/0006431 A1 | 1/2006 | Jean et al. |
| 2006/0030114 A1 | 2/2006 | Yeh et al. |
| 2007/0013026 A1 | 1/2007 | Kao |
| 2008/0149983 A1 | 6/2008 | Rassel et al. |

\* cited by examiner

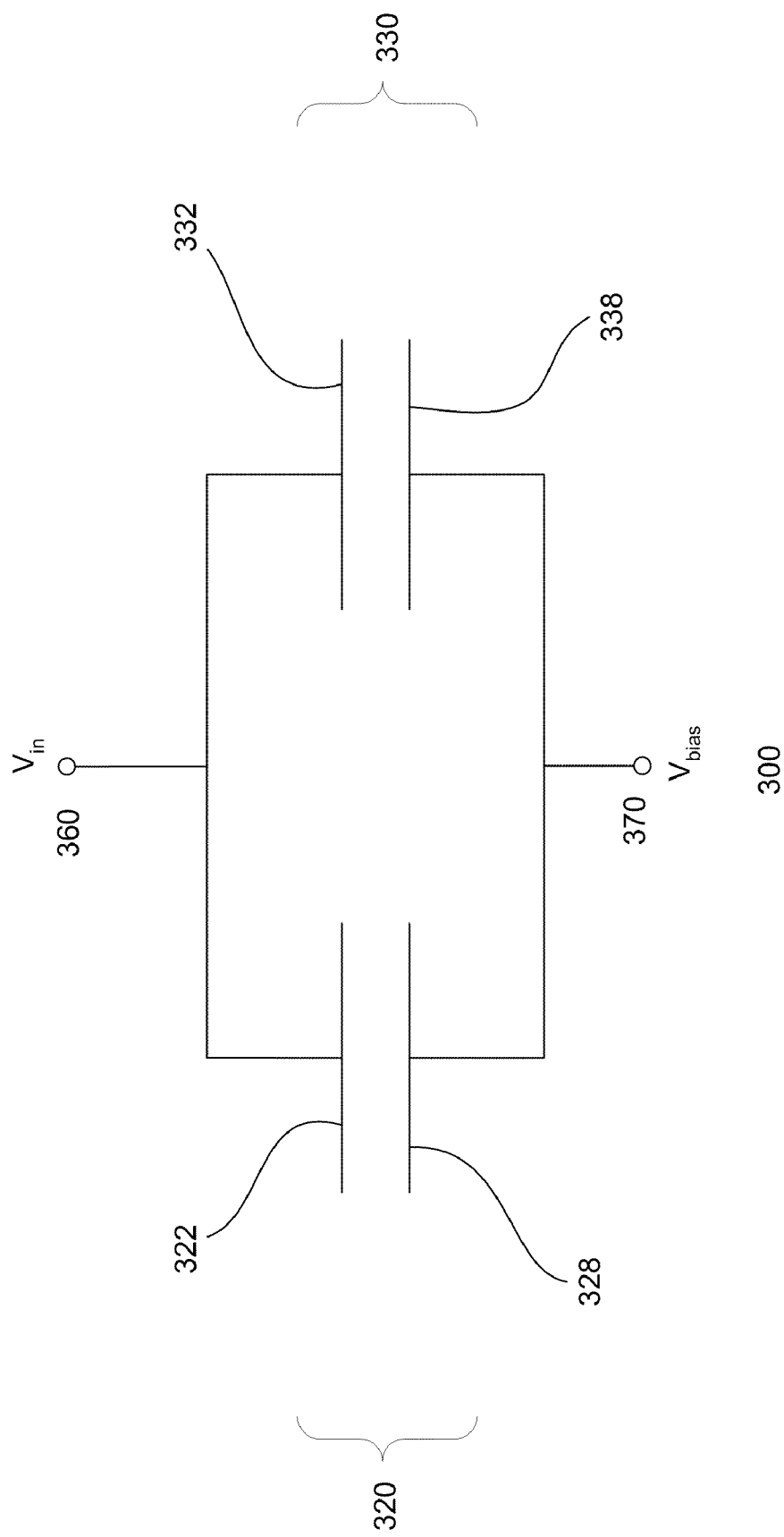

LATERAL JUNCTION VARACTOR WITH LARGE TUNING RANGE

CROSS REFERENCES TO RELATED APPLICATION

This application is a divisional application which claims benefit of U.S. patent application Ser. No. 11/858,890 filed on Sep. 20, 2007. The afore-mentioned application is incorporated herewith by reference.

FIELD OF THE INVENTION

The present invention relates generally to integrated circuits (ICs), and more particularly to junction varactors.

BACKGROUND OF THE INVENTION

In ICs, various components such as transistors, resistors, inductors, capacitors and varactors are configured to achieve the desired function. Generally, varactors are employed in analog applications. Varactors are essentially capacitors where the capacitance value varies with the voltage applied. One common type of varactors is a junction varactor.

FIG. 1 shows a conventional configuration 100 having a structure of a capacitor 110. The capacitor includes a first electrode 112 and a second electrode 118 (cathode and anode). A first terminal 160 is coupled to the cathode and a second terminal 170 is coupled to the anode. The anode and cathode are separated by a dielectric region 114. The width of the dielectric region determines the capacitance of the varactor. In general, wider the dielectric region, lower the capacitance. Additionally, larger the electrode area, higher the capacitance. The anode and cathode of the varactor can be formed at a p-on-n or n-on-p junction, with the depletion region at the junction serving as a dielectric region. Since the width of the depletion region can be modulated with the applied bias across the junction, a voltage dependent variable capacitor (varactor) results.

FIGS. 2a-b show cross-section views of a conventional n-on-p (NP) junction varactor 100. The junction varactor 110 is formed on a substrate 205. The substrate includes a p-well 218. Shallow trench isolations (STIs) 280 define first 162 and second 172a-b regions. A heavily doped n-type region is provided in the first region, creating an NP junction 214 with the p-well. The n-doped region serves as the anode while the p-well serves as the cathode. Contact to the p-well is achieved through heavily doped p-type regions at the surface of the second region. The input and bias voltages are applied to the cathode 160 and anode 170 terminals respectively.

A depletion region, indicated by dotted lines 216a-b, occurs at the NP junction. The capacitance of the varactor corresponds to the width of the depletion region, which can be varied by adjusting the voltages at the terminals. When the NP junction is at zero bias (i.e., $V_{in}=V_{bias}$), the depletion width is at its minimum, as shown in FIG. 2a, corresponding to a maximum capacitance ($C_{max}$). The width of the depletion region widens as the reverse bias across the junction is increased. Widening the depletion region decreases the capacitance of the varactor. When the maximum reverse voltage is applied, the depletion width is at its widest, as shown in FIG. 2b, corresponding to a minimum capacitance ($C_{min}$).

An important factor is the tuning range of the varactor, which corresponds to the capacitance range in which the varactor operates and is defined by the ratio $C_{max}/C_{min}$. Generally, it is desirable for a varactor to have a large tuning range to provide better functionality. Although junction varactors have better linearity compared to MOS-type varactors, they suffer from a smaller tuning range.

From the foregoing discussion, it is desirable to provide a junction varactor with a large tuning range.

SUMMARY OF THE INVENTION

The present invention relates to ICs. More particularly, the invention relates to junction varactors. In one embodiment, the junction varactor comprises of a substrate having a first doped well, into which two wells (second and third) of opposite polarity type are diffused at close proximity from each other. Thus two sets of junctions are created between the first well and each of the two wells of opposite polarity. The minimum distance between the second and third wells is maintained larger than their depletion widths at no bias condition.

In another aspect of the invention, a method for forming a junction varactor is provided. The method comprises of providing a substrate. A first doped well of a first polarity type, and second and third doped wells of a second polarity type are formed in the substrate. The second and third doped wells are separated by the first doped well, resulting in a lateral NPN or PNP structure.

In yet another aspect of the invention, an integrated circuit (IC) is disclosed. The IC comprises of a substrate and a junction varactor disposed in a varactor region of the substrate. The varactor region includes a first doped well which comprises of dopants of a first polarity type. The varactor region further includes second and third doped wells formed in the first doped well. The second and third doped wells comprises of a second polarity type, wherein the first, second and third doped wells form second-first-second polarity type lateral doped structure.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 3 shows a junction varactor in accordance with one embodiment of the invention which is represented by two capacitors connected in parallel;

DETAILED DESCRIPTION OF THE INVENTION

Figure 1:
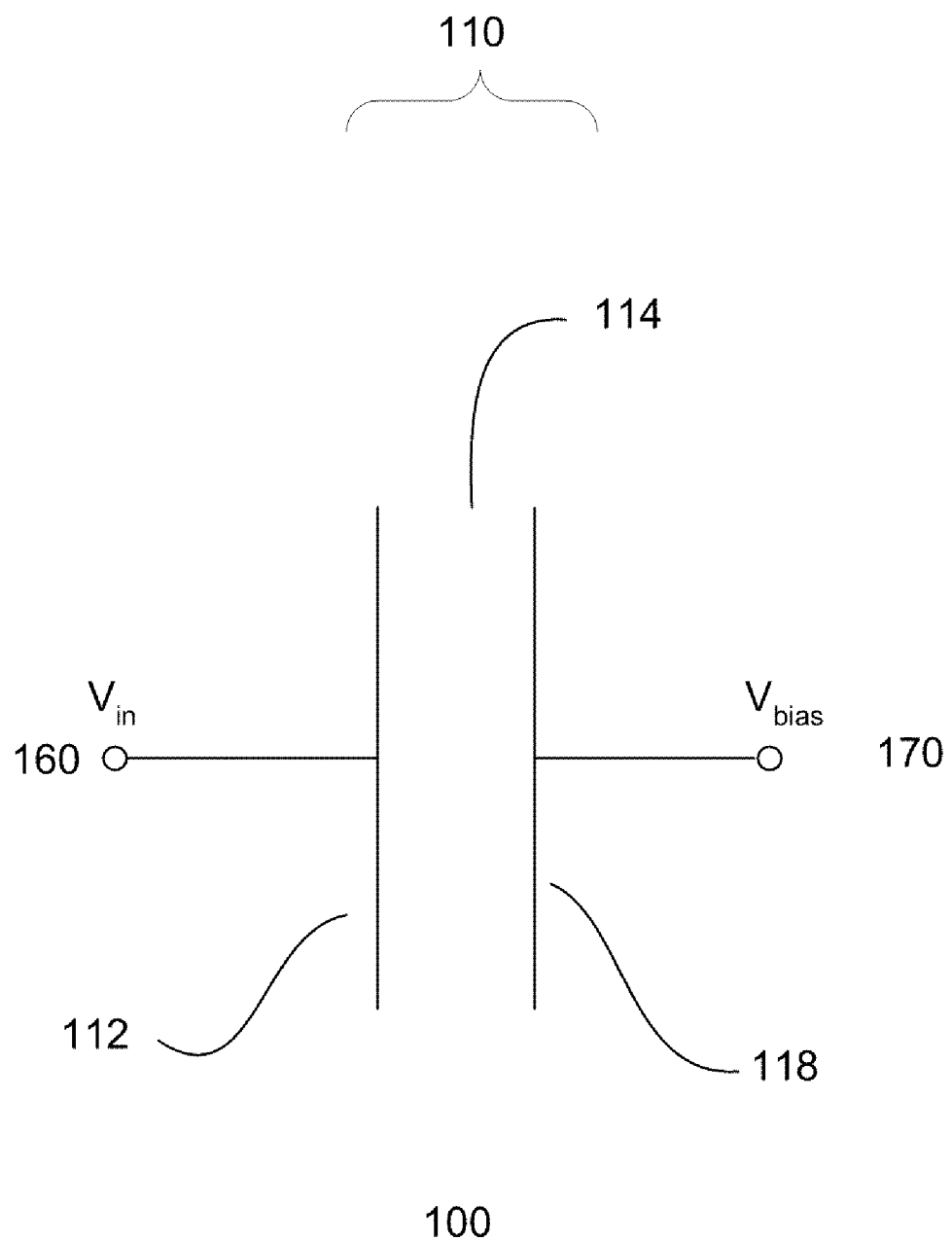
FIG. 1 shows a conventional capacitor structure representing a junction capacitor.
Figure 2A:
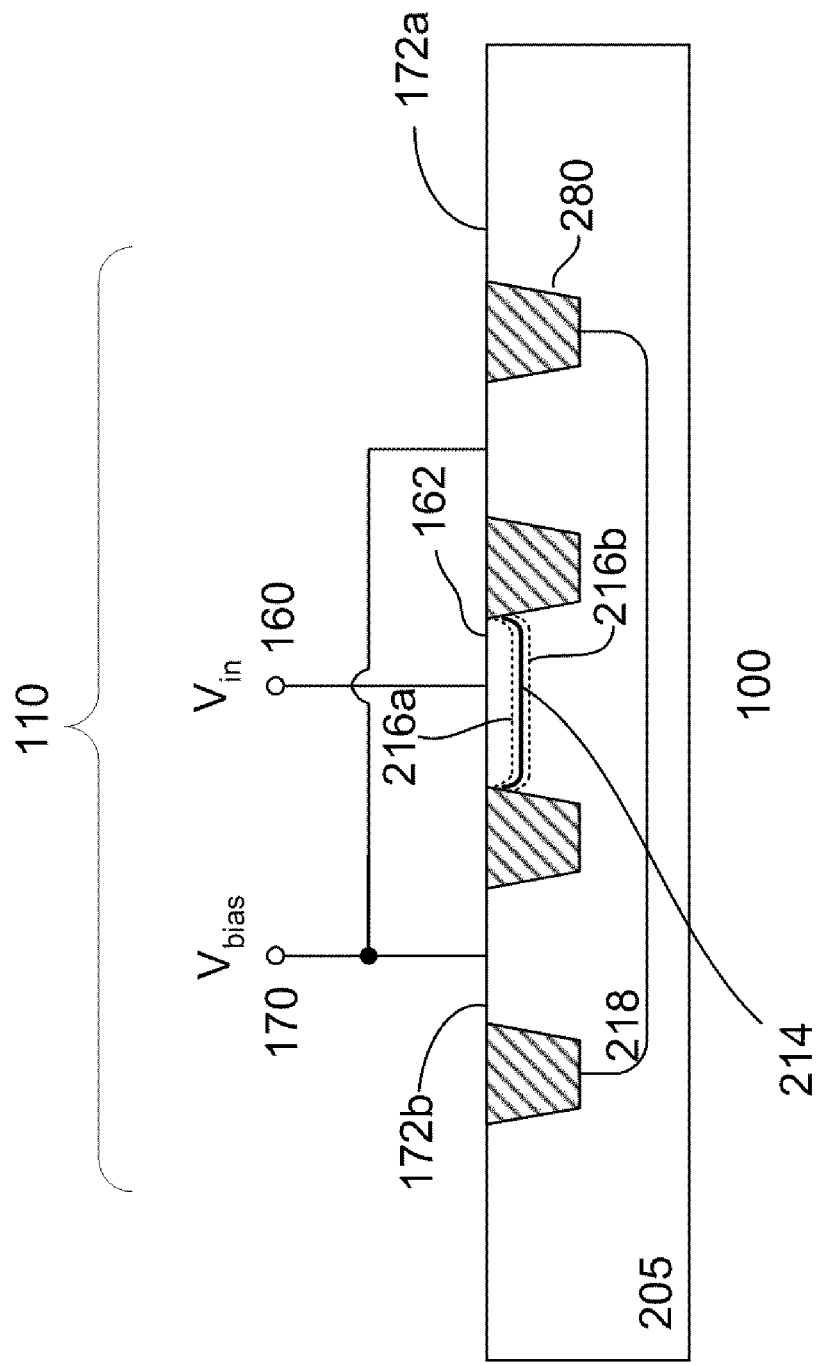
FIGS. 2a-b show cross-sectional views of a conventional junction varactor.
Figure 2B:
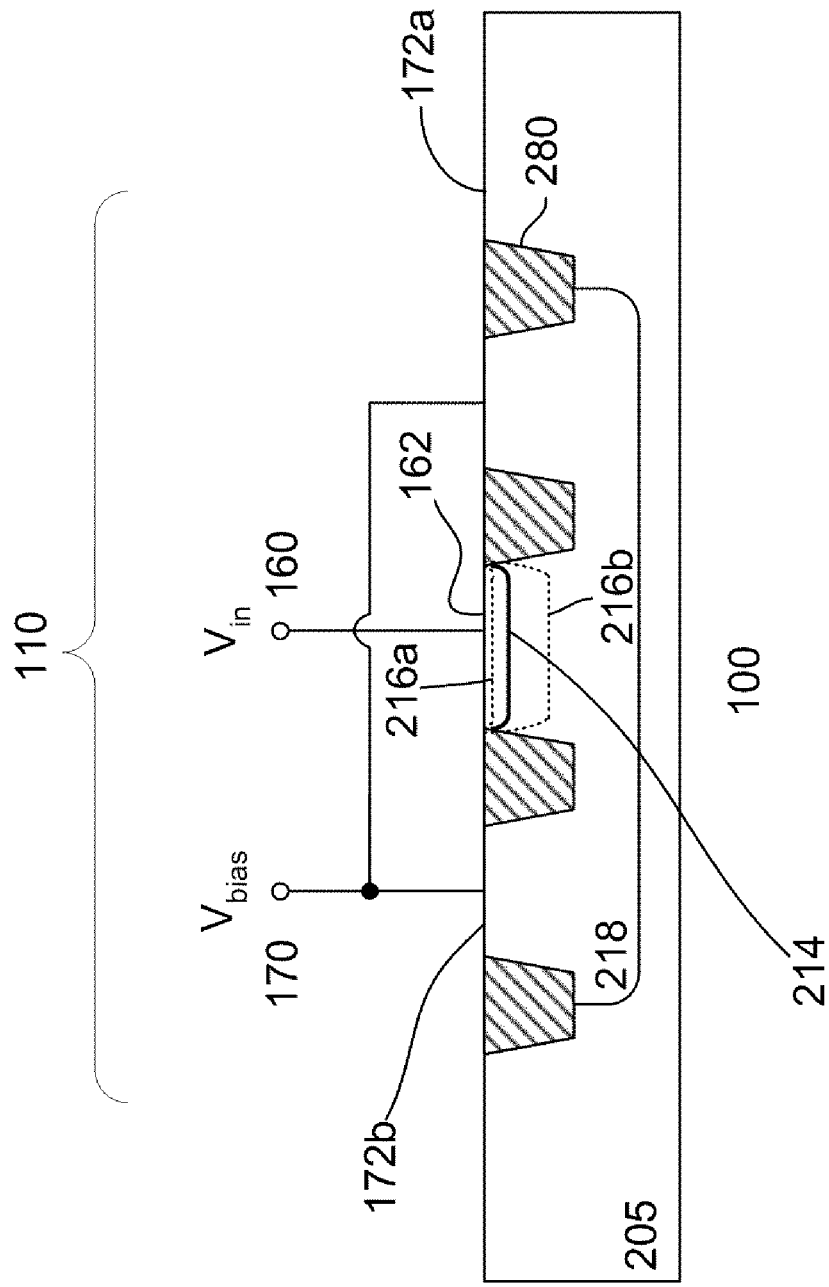

The present invention relates to junction varactors. The junction varactors can be incorporated into ICs. In particular, the junction varactors can easily be incorporated into ICs using standard CMOS processing technologies. The ICs can be any type of ICs, for example dynamic or static random access memories, signal processors, or system on chip (SOC) devices, mixed signal or analog devices such as A/D converters and switched capacitor filters. Other types of ICs are also useful. Such ICs are incorporated in, for example, communication systems and various types of consumer products.

FIG. 3 shows a varactor 300 in accordance with one embodiment of the invention. The varactor includes first and second capacitors 320 and 330 coupled in parallel. The capacitors' first electrodes 322 and 332 are commonly coupled to a first terminal 360 and second electrodes 328 and 338 are commonly coupled to a second terminal 370. The first electrodes comprise of a first polarity and the second electrodes comprise of a second (opposite) polarity. In one embodiment, the first polarity is a p-type polarity and the second polarity is a n-type polarity. For example, the first electrodes are cathodes and the second electrodes are anodes. An input voltage $V_{in}$ is provided to one of the terminals and a bias voltage $V_{bias}$ is provided to the other terminal. Accordingly, the total capacitance across terminals 360 and 370 is equal to the sum of the capacitance of the two individual capacitors.

Figure 4A:
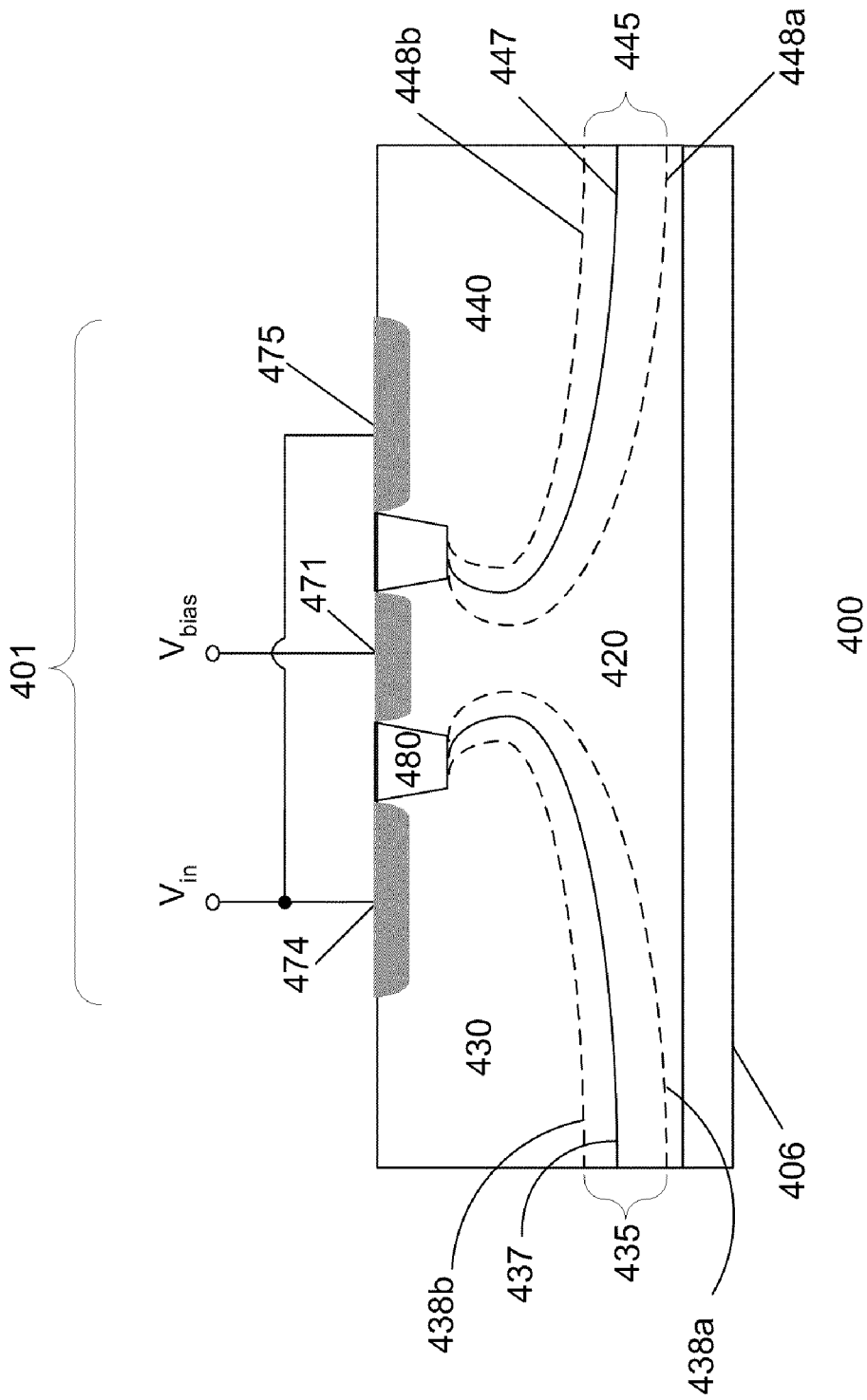
FIGS. 4a-b show cross-sectional views of a junction varactor in accordance with one embodiment of the invention.
Figure 4B:
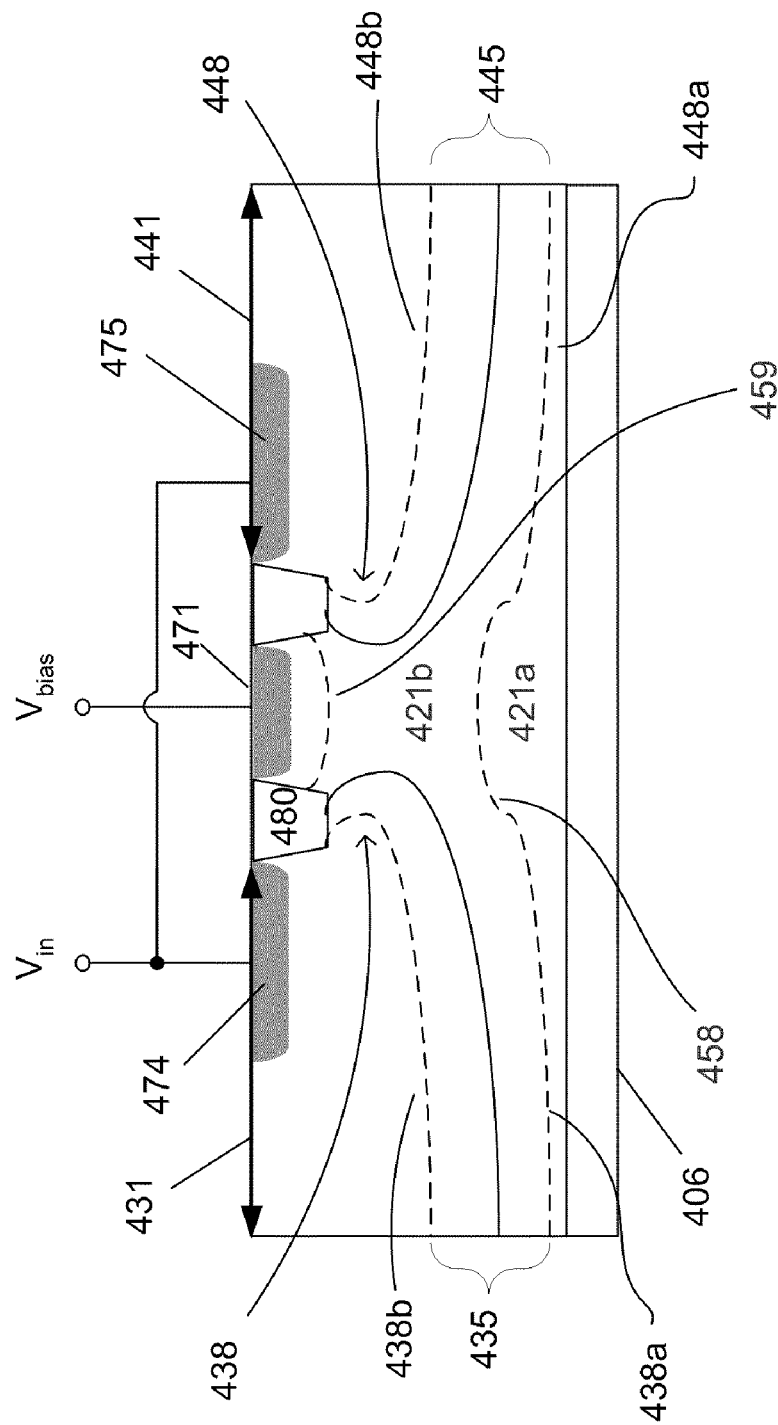

FIGS. 4a-b show cross-sectional views of a junction varactor 400 in accordance with one embodiment of the invention. The junction varactor is formed on a substrate 406. The substrate, for example, comprises of silicon. In one embodiment, the substrate, for example, comprises of a lightly doped p-type silicon substrate. Other types of substrates, such as silicon-on-insulator (SOI) or epitaxially grown silicon layers, are also useful. The varactor is formed in a varactor region 401 defined on the substrate. Isolation regions (not shown) are provided to separate the varactor region from other device regions. The isolation regions comprise of, for example, shallow trench isolation (STI) regions. Typically, the STI regions comprise of a trench filled with silicon oxide. Other types of isolation regions are also useful.

In one embodiment, the varactor region comprises of first, second and third sub-regions 420, 430 and 440. STIs 480 are provided on the substrate surface. Typically, the STIs extend below the substrate about 3500 angstroms (Å). Other depths are also useful. The STIs separate the sub-regions on the substrate surface. The second and third sub-regions comprise of a first polarity type doped region. The second and third sub-regions extend from the surface to a depth below the bottom of the STIs. The depth of the second and third sub-regions, for example, is about 4000 Å. Other depths are also useful. As for the first sub-region, it comprises of a second type doped region which extends from the surface of substrate between the STIs, isolating the second and third sub-regions. In one embodiment, the depth of the first sub-region is below the depth of the second and third sub-regions. The depth of the first sub-region preferably should be deep enough to ensure that depletion widths of the second and third regions at no bias condition are contained therein, enhancing the capacitor area to increase $C_{max}$. The dopant concentration of the sub-regions, for example, is about 1e18-1e19/cc. Other dopant concentrations are also useful. In one embodiment, the dopant concentration and depths of the sub-regions can be selected to be compatible with CMOS processes. Alternatively, the sub-regions can be tailored to achieve the desired design requirements.

The interface between the first and second sub-regions forms a first PN junction 437. Similarly, the interface between the first and third sub-regions forms a second PN junction 447. The first and second junctions are separated by the first sub-region. As a result, a lateral NPN or PNP type doped structure is formed. First and second depletion regions 435 and 445, defined by inner and outer boundaries 438a-b or 448a-b, are located at the first and second junctions.

In one embodiment, contact regions 471, 474 and 475 are provided on the surface of the substrate at the first, second and third sub-regions. The contact regions, in one embodiment, comprise of heavily doped regions of the same type as the sub-region. The contacts typically extend below the substrate surface about 1000 Å. Other depths are also useful. The contact regions serve as terminals for the varactor to, for example, receive input and bias voltages. In one embodiment, the second and third contact regions are commonly coupled. In one embodiment, the second and third contact regions are commonly coupled to $V_{in}$ and the first contact region is coupled to $V_{bias}$. Other arrangements are also useful.

The width of the depletion region (defined by the inner and outer boundaries) determines the capacitance of the varactor and can be varied by adjusting the voltage across the terminals. The width of the depletion region is inversely related to the capacitance of the varactor. The minimum width of the depletion region corresponds to maximum capacitance ($C_{max}$) while the maximum width of the depletion region corresponds to minimum capacitance ($C_{min}$).

The varactor operates from about zero bias to full reverse bias. Generally, the voltage at one terminal is fixed while the voltage at the other terminal is varied. For example, $V_{bias}$ is a fixed voltage while $V_{in}$ is a variable voltage. Other configurations, such as varying both voltages, are also useful. In one embodiment, $V_{bias}$ is equal to 0 V and $V_{in}$ is varied from 0 V to |$V_{DD}$|. Providing other input voltage ranges, such as greater than $V_{DD}$, is also useful. Depending on the configuration, $V_{DD}$ can either be +$V_{DD}$ or −$V_{DD}$. The range of $V_{in}$ corresponds to zero bias to full reverse bias. For example, at $V_{in}$=0 V, the varactor is operating in zero bias. As $V_{in}$ increases, the varactor is operating in increasing reverse bias. The varactor is in full reverse bias when $V_{in}$ reaches |$V_{DD}$|. Other voltage ranges are also useful.

At zero bias, the width of the depletion regions is at their minimum, as shown in FIG. 4a. In such case, the depletion regions are isolated from each other by the first sub-region. This corresponds to $C_{max}$, which is the summation of the two individual junction capacitors connected in parallel. The depletion regions become wider with increasing reverse bias conditions. At full reverse bias voltage (e.g., $V_{in}$ equal to about |$V_{DD}$|), the depletion regions are at their widest, as shown in FIG. 4b, corresponding to $C_{min}$.

In one embodiment, near or at full reverse bias, the first and second depletion regions merge. The merging of the depletion region, in one embodiment, forms a lower boundary 458 and an upper boundary 459, separating the first sub-region into lower and upper portions 421a-b. With this separation, the main component of the capacitance is limited to portions 438 and 448 of the junctions under the STIs. Bottom portions of the junctions are isolated by the merged depletion region.

Thus, under reverse bias, due to the merging of the two lateral depletion regions, the net area of the junction is drastically reduced. This in turn reduces their capacitance values. As such, $C_{min}$ is drastically reduced not only due to increased depletion widths but also due to significant decrease in junction area. As shown, $C_{max}$ at no bias condition is enhanced by adding two junction capacitors in parallel and $C_{min}$ at reverse bias is reduced by reducing the capacitor area severely. This enables the tuning range ($C_{max}/C_{min}$) to be enhanced significantly. For example, increasing the horizontal lengths of the second and third sub-regions will increase $C_{max}$ while $C_{min}$ remains about the same after the depletion regions merge, isolating the horizontal junction areas. Consequently, the tuning range can theoretically be increased indefinitely by simply increasing the horizontal lengths of the junctions.

Figure 5A:
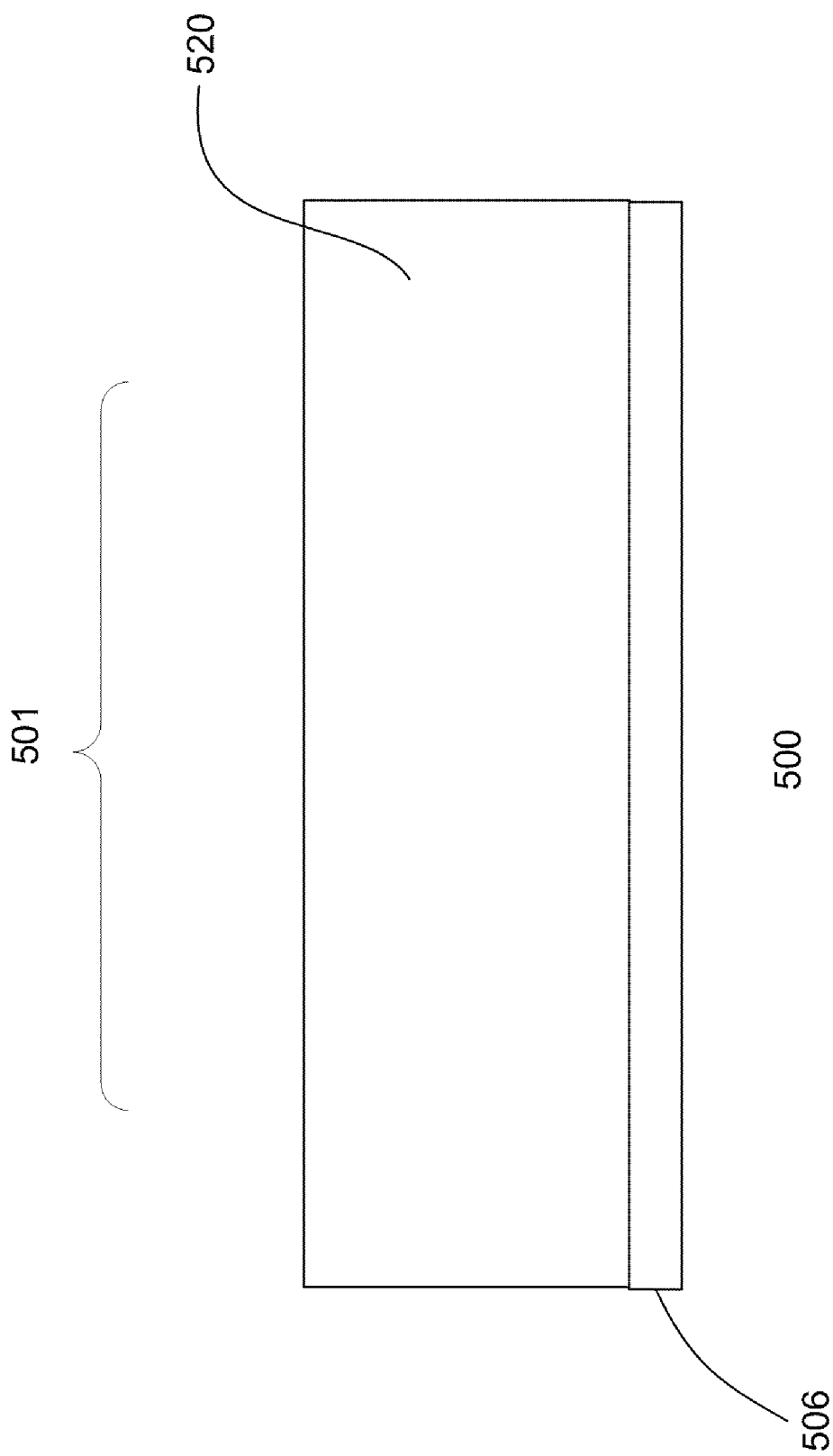
FIGS. 5a-d show a process for forming a varactor in accordance with one embodiment of the invention.

FIGS. 5a-d show a process for forming a NPN varactor 500 in accordance with one embodiment of the invention. Referring to FIG. 5a, a semiconductor substrate 506 is provided. The substrate, for example, comprises of a lightly doped p-type silicon substrate. Other types of substrates, such as SOI and epitaxial silicon layers, may also be used. A varactor region 501 is defined on the substrate. A first doped well 520 having first polarity type dopants is formed in the varactor region. The first polarity type dopants, for example, comprise of p-type dopants. Providing first polarity type comprising of n-type dopants is also useful. In one embodiment, the first well comprises of p-type dopants at a concentration of about 1e18-1e19/cc. The depth of the first doped well is about 5000-6000 Å. Other depths can also be useful.

Figure 5B:
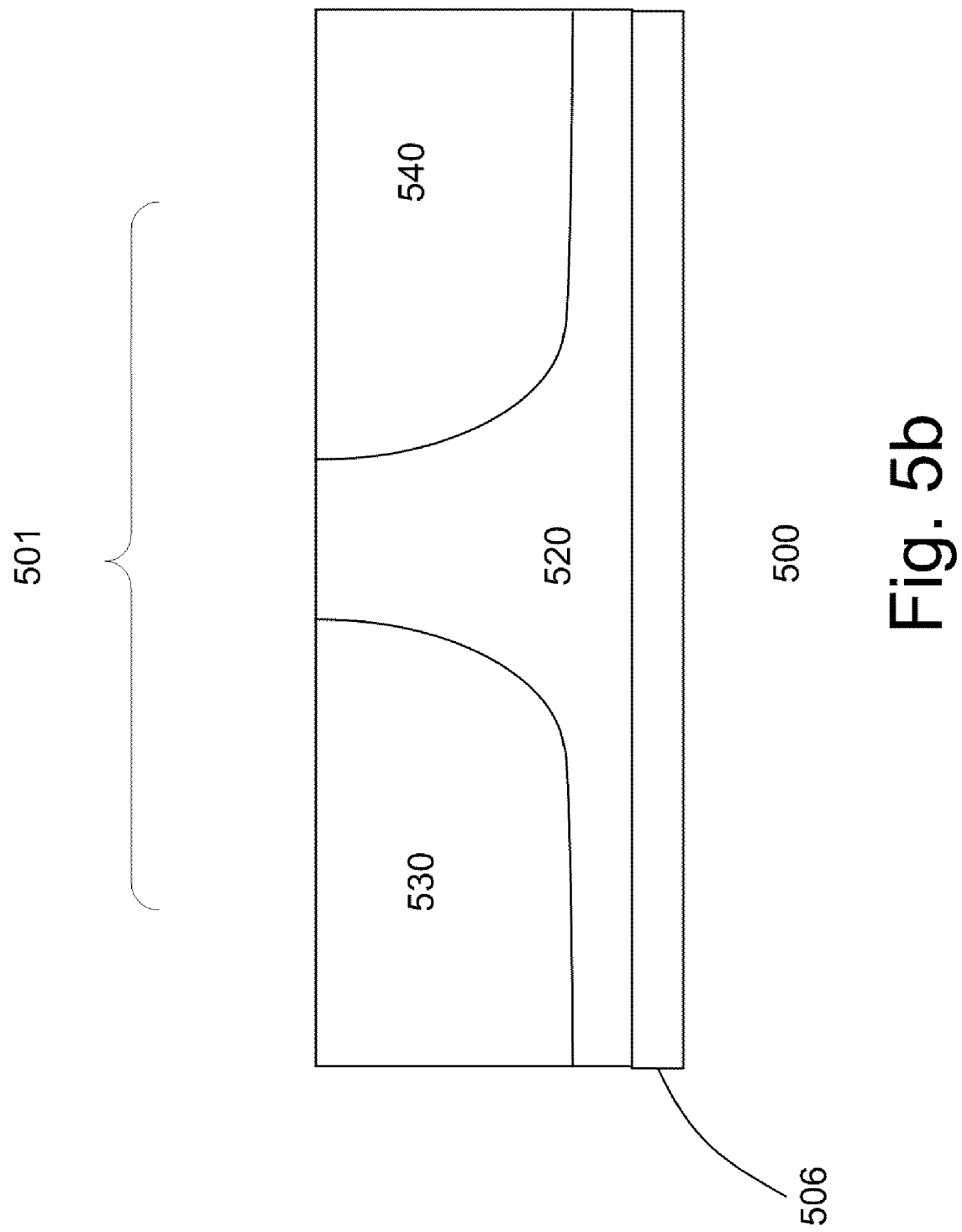

Referring to FIG. 5b, second and third doped wells 530 and 540 are formed in the varactor region. In one embodiment, the second and third doped wells are formed such that they are separated by the first doped well. The second and third doped wells comprise of second polarity type dopants, such as n-type dopants. Providing p-type second polarity type dopants is also useful. In one embodiment, the second and third doped wells comprise of n-type dopants at a concentration of about 1e18-1e19/cc. The second and third doped wells comprise of a depth which is shallower than the first well. Typically, the depth of the second and third wells is about 4000 Å. The distance between the second and third wells is selected such that depletion regions at the junctions are separated by the first well at, for example, zero bias. The depletion regions at the junctions merge at near or full reverse bias.

To form the wells, conventional ion implantation techniques can be used. Typically, a mask layer is used to selectively implant dopants to form the well. In one embodiment, separate ion implantation processes are used for different wells. Suitably tailored well implants of a CMOS process can be shared to form the wells. Preferably, the wells can be formed without the use of additional masks. For example, the p-well of the varactor can be formed when p-wells for CMOS devices are formed, using the same implant mask. Alternatively, the wells for the varactors are formed separately from wells of the CMOS devices, using additional masks. This allows wells to be optimized for the varactors.

Figure 5C:
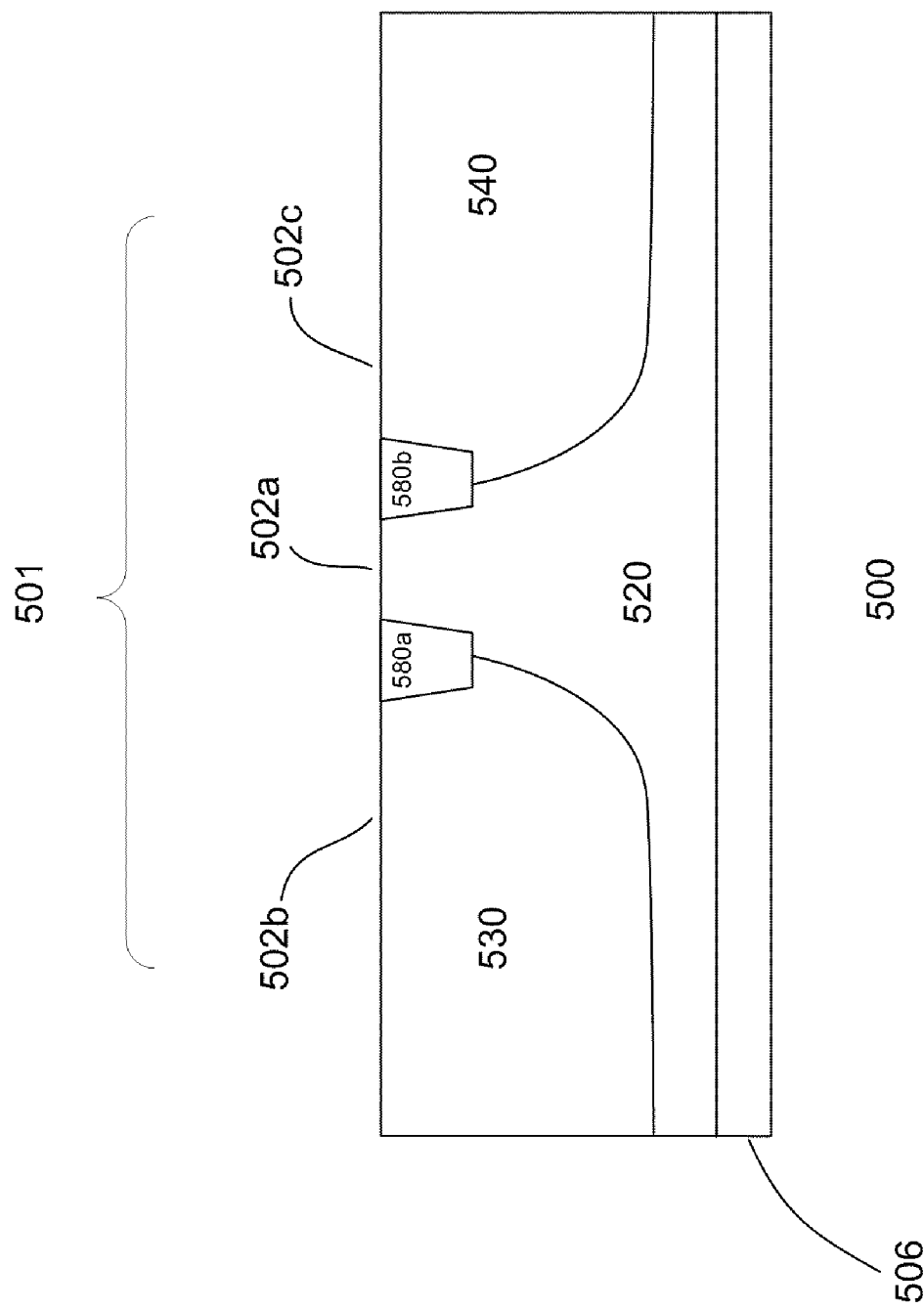

In FIG. 5c, STIs are formed on the substrate surface. In one embodiment, first and second STIs 580a-b are formed, defining regions 502a-c on the surface of the substrate. STIs (not shown) are also formed to isolate the varactor region from other device regions. The depth of the STI regions is shallower than the junctions but sufficiently deep to prevent punch-through. Typically, the STI regions have a depth of about 3000-4000 Å below the substrate surface. Other depths are also useful. The STIs can be formed using various conventional processes. For example, the substrate can be etched using conventional etch and mask techniques to form trenches which are then filled with dielectric material such as silicon oxide. Chemical mechanical polishing (CMP) can be performed to remove excess oxide and provide a planar substrate top surface.

Figure 5D:
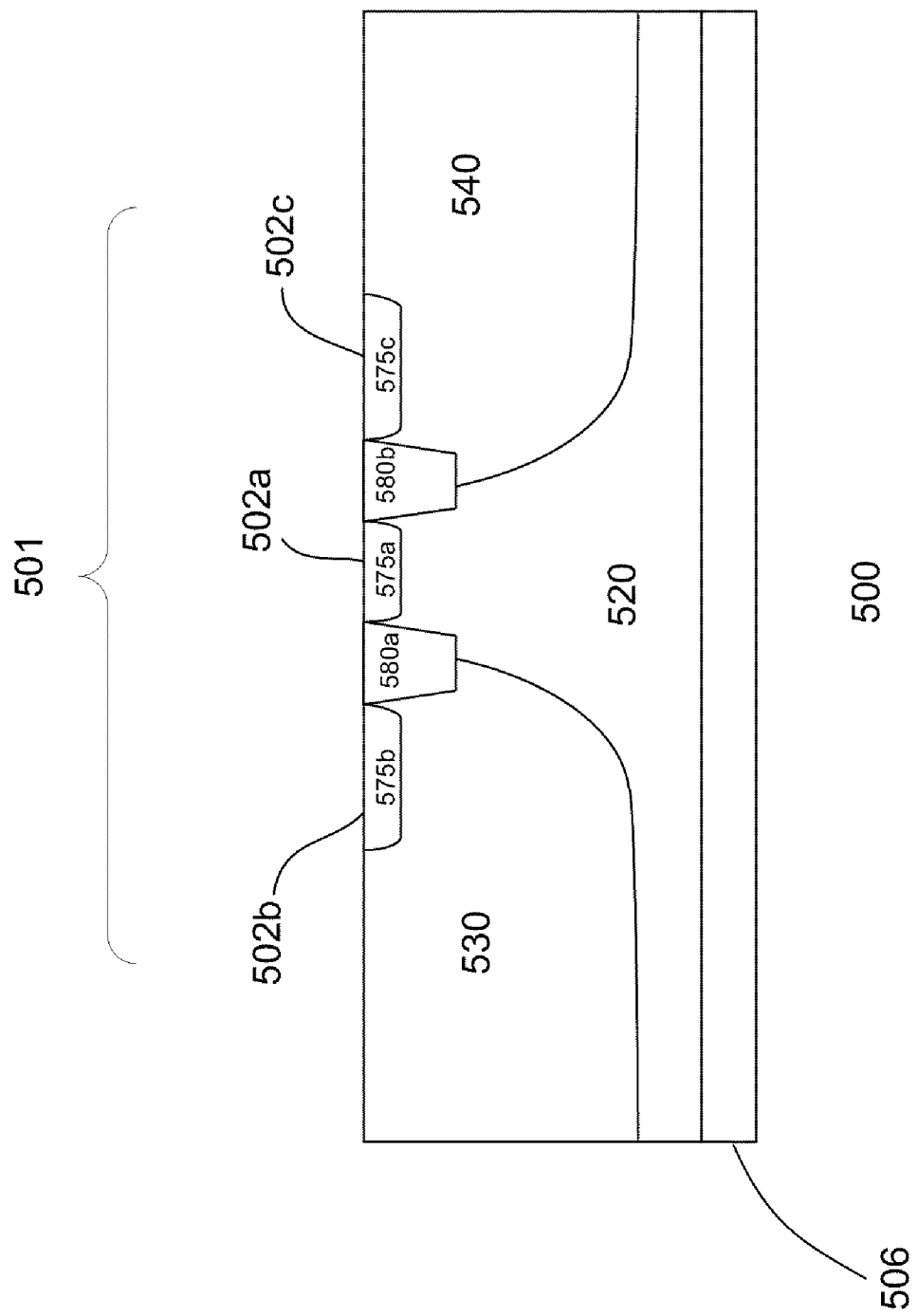

In one embodiment, the first and second STIs isolate the wells at the surface of the substrate. The PN junctions along with their depletion regions are located below the STIs. Referring to FIG. 5d, heavily doped regions 575a-c are formed in regions 502a-c, forming connections to the wells. Conventional techniques, such as ion implantation and masking are used to form the heavily doped regions. For example, the first doped region comprises of a heavily doped n-type region while the second and third doped regions comprise of heavily doped p-type regions. As described, STIs are formed after the first, second and third doped wells are formed. Alternatively, the STIs can be formed prior to the formation of one or more doped wells. In one embodiment, the second and third doped wells are formed after formation of the STIs.

The process continues to form interconnections to the varactor doped regions 575a-c to provide the bias and input voltages as desired, producing the final structure, for example, as depicted by FIGS. 4a-b. Contacts to the doped regions can also be formed. Preferably, the contacts are formed in the same process for forming source/drain implants of CMOS or bipolar processes. The area occupied by the present invention may or may not be the same as the conventional varactors, depending on design requirements. As described, the process forms a NPN lateral junction varactor. The process can be easily modified to form a PNP lateral junction varactor. For example, the second and third doped wells comprise of p-wells while the first doped well comprises of a n-well.

The varactor of the present invention can be easily integrated into conventional CMOS processes without the use of any extra mask for implantation. The present invention can also be easily integrated into conventional bipolar processes. For example, the masks can be modified to include implants for the varactors. By sharing masks with other devices, no additional steps are required, thus reducing manufacturing cost.

Figure 6:
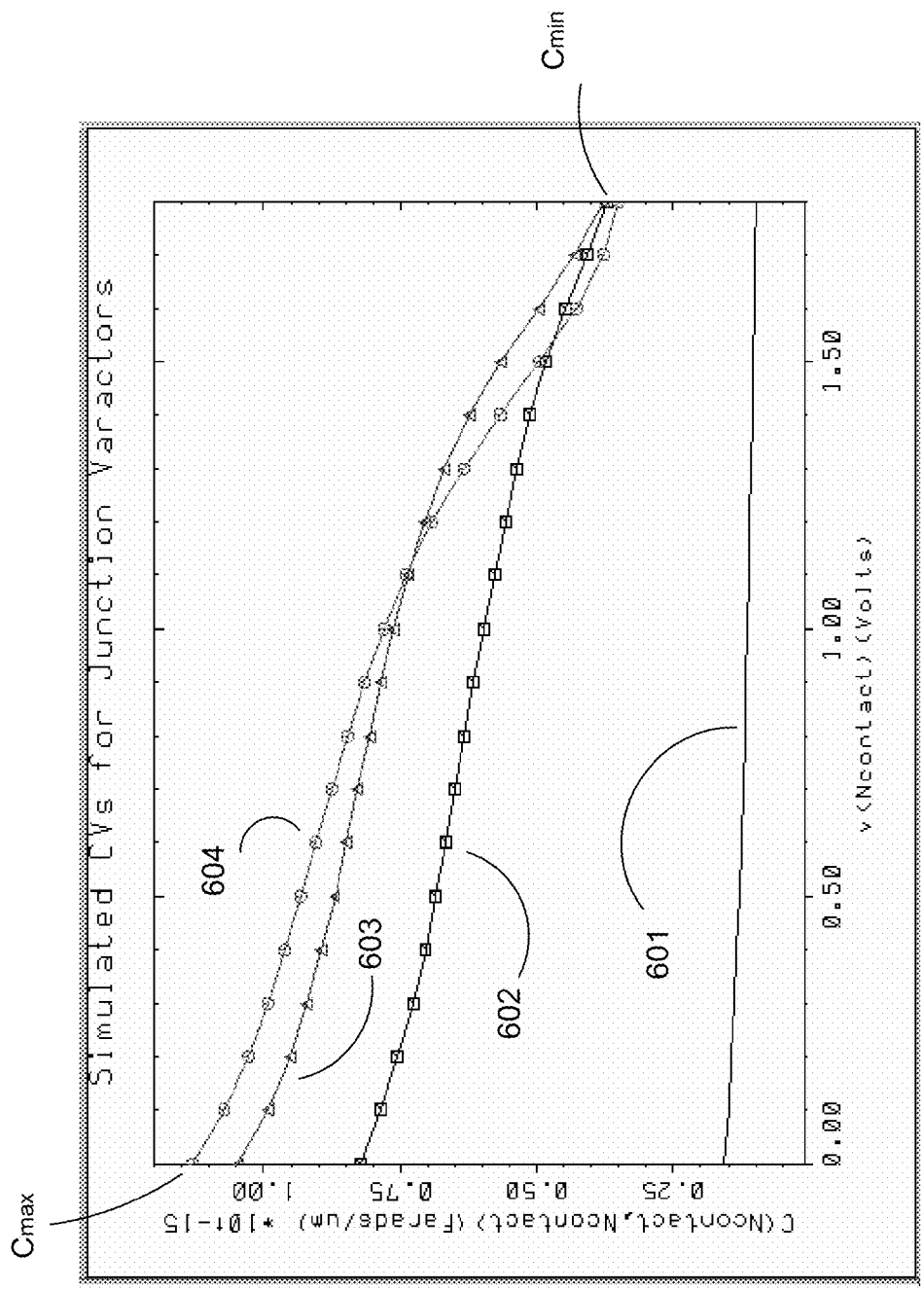
FIG. 6 shows simulated CV curves comparing the tuning range of a conventional junction varactor with that of a junction varactor in accordance with one embodiment of the invention for a standard CMOS process, and the effect of varying the lengths of the varactor structure in accordance with another embodiment of the invention using the CMOS process.

FIG. 6 shows simulated capacitance-voltage (CV) curves of junction varactors of various configurations. CV curve 601 corresponds to a conventional NP junction varactor, while CV curves 602, 603 and 604 correspond to a NPN junction varactor with the n-well horizontal lengths of 0.2 µm, 0.7 µm and 1.2 µm, respectively. As shown in FIG. 6 by 601, the NP junction varactor has a minimum capacitance at 1.8 V of about $0.1 \times 10^{-15}$ F/µm and a maximum capacitance at 0 V of about $0.16 \times 10^{-15}$ F/µm. The tuning range of the NP junction varactor, which is the ratio of $C_{max}/C_{min}$, is about 1.6. For the NPN junction varactor, the effect of increasing n-well length is illustrated by comparing CV curves 603 and 604 with CV curve 602, which represents a constant length of 0.2 µm. As the n-well length is varied from 0.2 µm to 1.2 µm, a clear corresponding increase of the maximum capacitance can be observed, varying from approximately $0.825 \times 10^{-15}$ F/µm, $1.05 \times 10^{-15}$ F/µm and $1.125 \times 10^{-15}$ F/µm, while the minimum capacitance is preserved at a substantially constant value in a range of approximately $0.33 \times 10^{-15}$ F/µm to $0.38 \times 10^{-15}$ F/µm. This results in a tuning range of about 2.3 to 3.3 from each corresponding variance. Clearly, the NPN junction varactor of the present invention has more than at least 1.4 times the tuning range of a conventional NP junction varactor, depending on the extension of 603 and 604 with respect to 602. Thus, by increasing the horizontal lengths of the second and third sub-regions (for example, as depicted by lengths 431 and 441 in FIG. 4b), a tuning range of any desired magnitude can be achieved. Increasing the horizontal lengths, however, increases area of the varactor.

Figure 7A:
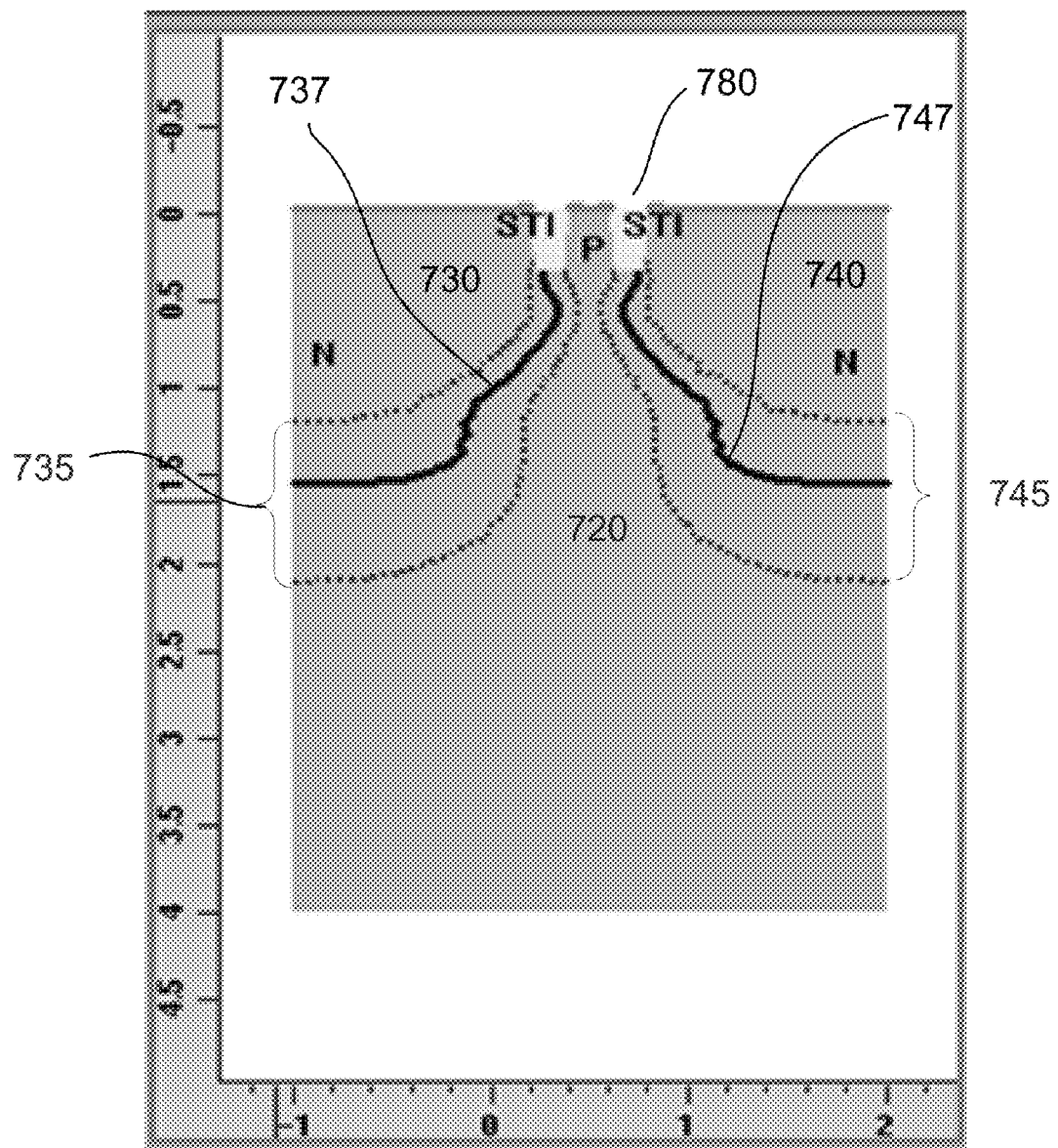
FIGS. 7a-b show simulated behavior of a junction varactor in accordance with one embodiment of the invention, before and after a reverse voltage bias between first region with the second and third regions are provided.
Figure 7B:
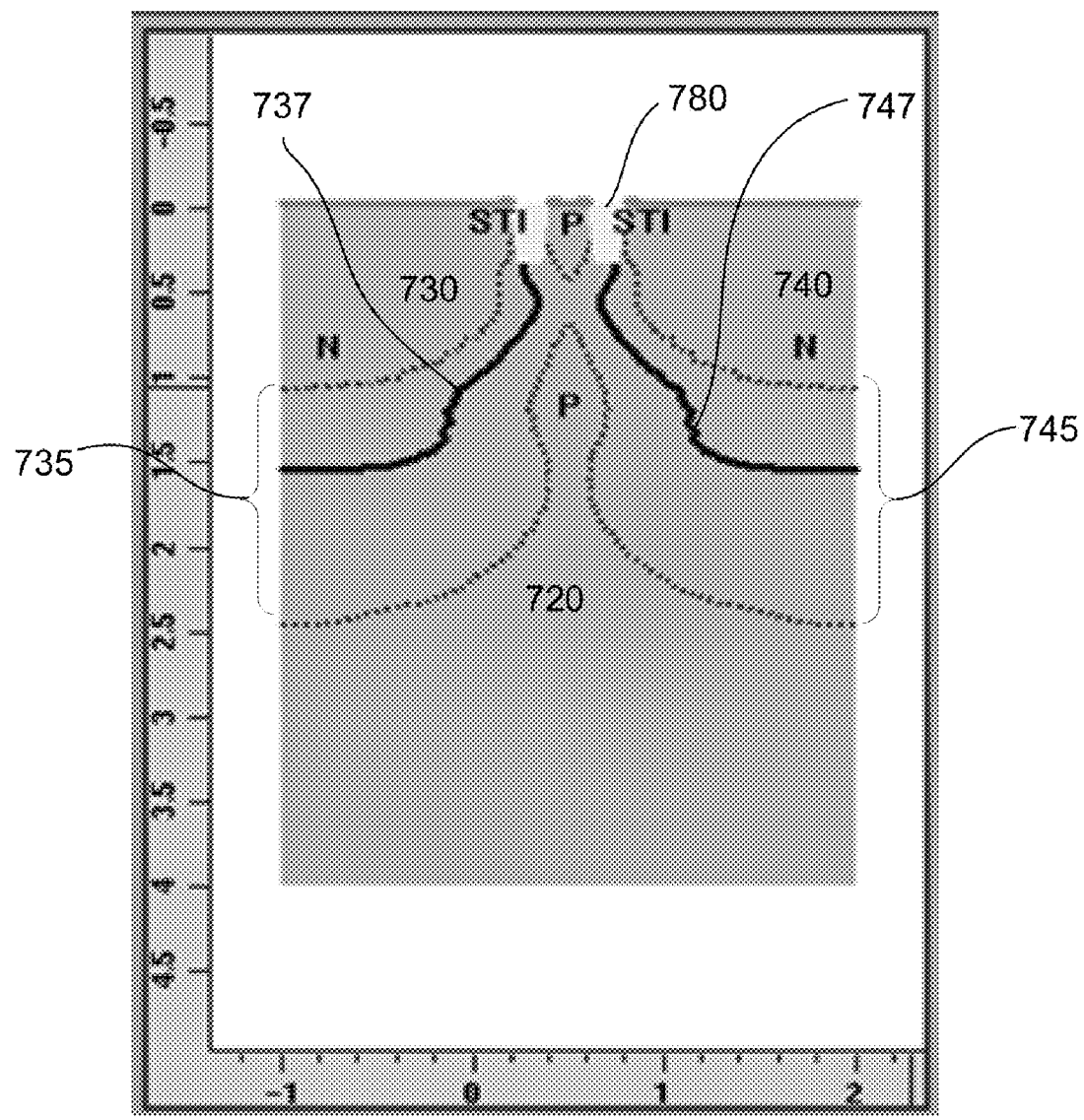

FIGS. 7a-b show simulation results of a lateral NPN junction varactor in accordance with one embodiment of the invention. The simulation is based on a standard 1.8 V, 0.18 µm process. The NPN junction varactor includes first and second n-wells 730 and 740 formed in a p-well 720. The junction varactor includes a depletion region 735 at a first PN junction 737 and a second depletion region 745 at the second junction 747. The wells are separated by STIs 780 at the surface of the substrate. At zero bias, the depletion regions of both junctions do not merge, as shown in FIG. 7a. This corresponds to the maximum capacitance of the junction varactor, $C_{max}$. In full reverse bias, as shown in FIG. 7b, the depletion regions merge. This corresponds to the minimum capacitance of the junction varactor, $C_{min}$.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A junction varactor comprising:
   a substrate;
   a first doped region of a first polarity type;
   second and third doped wells of a second polarity type, wherein the second and third doped wells are separated by the first doped region, resulting in a second-first-second polarity type lateral doped structure having first and second PN junctions formed by the first doped region and the wells and first and second depletion regions at the first and second PN junctions; and
   wherein the first doped region is coupled to a first terminal of the varactor and the second and third doped wells are commonly coupled to a second terminal of the varactor.

2. The varactor of claim 1 wherein:
   the first polarity type comprises of n-type and the second polarity type comprises of p-type, wherein the lateral doped structure comprises of a PNP lateral doped structure; or
   the first polarity type comprises of p-type and the second polarity type comprises of n-type, wherein the lateral doped structure comprises of a NPN lateral doped structure.

3. The varactor of claim 1 wherein the first varactor terminal is coupled to a first voltage supply comprising a bias voltage supply and the second varactor terminal is coupled to a second voltage supply comprising an input voltage supply which can be varied to cause the varactor to operate from zero bias to reverse bias.

4. The varactor of claim 1 further comprises first, second and third contact regions contacting respective first doped region, second and third doped wells, wherein first and second isolation regions are provided on the substrate, the first isolation region isolates the first and second contact regions and the second isolation region isolates the first and third contact regions.

5. The varactor of claim 4 wherein the isolation regions comprise of shallow trench isolation regions.

6. The varactor of claim 5 wherein the first contact region is coupled to a first voltage supply and the second and third contact regions are commonly coupled to a second voltage supply.

7. The varactor of claim 1 wherein width of the first and second depletion regions are operable to vary from minimum width to maximum width depending on whether the varactor is operating in zero bias or reverse bias mode, varying the capacitance of the varactor from $C_{max}$ to $C_{min}$.

8. The varactor of claim 6 wherein the first voltage supply comprises of a bias voltage supply and the second voltage supply comprises of an input voltage supply which can be varied to cause the varactor to operate from zero bias to reverse bias.

9. The varactor of claim 8 wherein the first and second depletion regions merge at or near full reverse bias mode.

10. The varactor of claim 8 further comprises first, second and third contact regions contacting respective first, second and third doped wells, wherein first and second isolation regions are provided on the substrate, the first isolation region isolates the first and second contact regions and the second isolation region isolates the first and third contact regions.

11. The varactor of claim 10 wherein the isolation regions comprise of shallow trench isolation regions.

12. The varactor of claim 10 wherein the first contact region is coupled to a first voltage supply and the second and third contact regions are commonly coupled to a second voltage supply.

13. The varactor of claim 12 wherein the first voltage supply comprises of a bias voltage supply and the second voltage supply comprises of an input voltage supply which can be varied to cause the varactor to operate from zero bias to reverse bias.

14. The varactor of claim 1 wherein the first doped region is a first doped well.

15. The varactor of claim 14 wherein the first doped well is deeper than the second and third doped wells.

16. The varactor of claim 15 wherein the first varactor terminal is coupled to a first voltage supply comprising a bias voltage supply and the second varactor terminal is coupled to a second voltage supply comprising an input voltage supply which can be varied to cause the varactor to operate from zero bias to reverse bias.

17. The varactor of claim 16 wherein the width of the first and second depletion regions are operable to vary such that the first and second depletion region are separated at a zero bias and merged at a first reverse bias value.

18. The varactor of claim 1 wherein the width of the first and second depletion regions are operable to vary such that the first and second depletion region are merged at a first reverse bias value and separated at a second bias value.

19. A semiconductor device comprising:
   a substrate;
   a first doped well of a first polarity type;
   second and third doped wells of a second polarity type, wherein the second and third doped wells are separated by the first doped well, resulting in a second-first-second polarity type lateral doped structure having first and second PN junctions formed by the wells and first and second depletion regions at the first and second PN junctions;
   first, second and third contact regions contacting respective first, second and third doped wells, wherein first and second isolation regions are provided on the substrate, the first isolation region isolates the first and second contact regions and the second isolation region isolates the first and third contact regions; and
   wherein the first contact region is coupled to a first terminal of the device and the second and third contact regions are commonly coupled to a second terminal of the device.

20. A semiconductor device comprising:
a substrate;
a first doped well of a first polarity type (FP);
second and third doped wells of a second polarity type (SP), wherein the second and third doped wells are separated by the first doped well, resulting in a second-first-second polarity type lateral doped structure having first and second FP/SP junctions formed by the wells and first and second depletion regions at the first and second FP/SP junctions; and
wherein the first contact region is coupled to a first terminal of the device and the second and third contact regions are commonly coupled to a second terminal of the device.

21. The device of claim 20 wherein:
the first polarity type comprises P type and the second polarity type comprises N type; or
the first polarity type comprises N type and the second polarity type comprises P type.

* * * * *